(12) United States Patent
Kim et al.

(10) Patent No.: US 11,610,847 B2
(45) Date of Patent: Mar. 21, 2023

(54) LASER-BASED REDISTRIBUTION AND MULTI-STACKED PACKAGES

(71) Applicant: STATS ChipPAC Pte. Ltd., Singapore (SG)

(72) Inventors: ChangOh Kim, Incheon (KR);
KyoungHee Park, Seoul (KR);
SeongHwan Park, Incheon (KR);
JinHee Jung, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 17/314,916

(22) Filed: May 7, 2021

(65) Prior Publication Data

US 2022/0359420 A1    Nov. 10, 2022

(51) Int. Cl.
| H01L 23/552 | (2006.01) |
| H01L 21/56 | (2006.01) |
| H01L 23/66 | (2006.01) |
| H01L 23/31 | (2006.01) |
| H01L 21/48 | (2006.01) |
| H01Q 1/22 | (2006.01) |

(52) U.S. Cl.
CPC .......... *H01L 23/552* (2013.01); *H01L 21/486* (2013.01); *H01L 21/56* (2013.01); *H01L 23/31* (2013.01); *H01L 23/66* (2013.01); *H01Q 1/2283* (2013.01)

(58) Field of Classification Search
CPC ..... H01L 23/552; H01L 21/486; H01L 21/56; H01L 23/31; H01L 23/66; H01Q 1/2283
USPC ........................................................ 257/659
See application file for complete search history.

(56) References Cited

U.S. PATENT DOCUMENTS

| 7,633,765 | B1 | 12/2009 | Scanlan et al. |
| 8,283,205 | B2 | 10/2012 | Pagaila et al. |
| 9,202,742 | B1 | 12/2015 | Kim et al. |
| 9,331,007 | B2 | 5/2016 | Yoon et al. |
| 9,406,533 | B2 | 8/2016 | Chi et al. |
| 2012/0018897 | A1 | 1/2012 | Park et al. |
| 2016/0351608 | A1* | 12/2016 | Huang .............. H01L 27/14636 |
| 2019/0214772 | A1* | 7/2019 | Kodama ............ H01R 13/6582 |
| 2020/0075503 | A1* | 3/2020 | Chuang ................ H01Q 1/2283 |

* cited by examiner

*Primary Examiner* — Didarul A Mazumder
(74) *Attorney, Agent, or Firm* — Brian M. Kaufman; Robert D. Atkins; Patent Law Group: Atkins and Associates, P.C.

(57) ABSTRACT

A semiconductor device has a first package layer. A first shielding layer is formed over the first package layer. The first shielding layer is patterned to form a redistribution layer. An electrical component is disposed over the redistribution layer. An encapsulant is deposited over the electrical component. A second shielding layer is formed over the encapsulant. The second shielding layer is patterned. The patterning of the first shielding layer and second shielding layer can be done with a laser. The second shielding layer can be patterned to form an antenna.

22 Claims, 11 Drawing Sheets

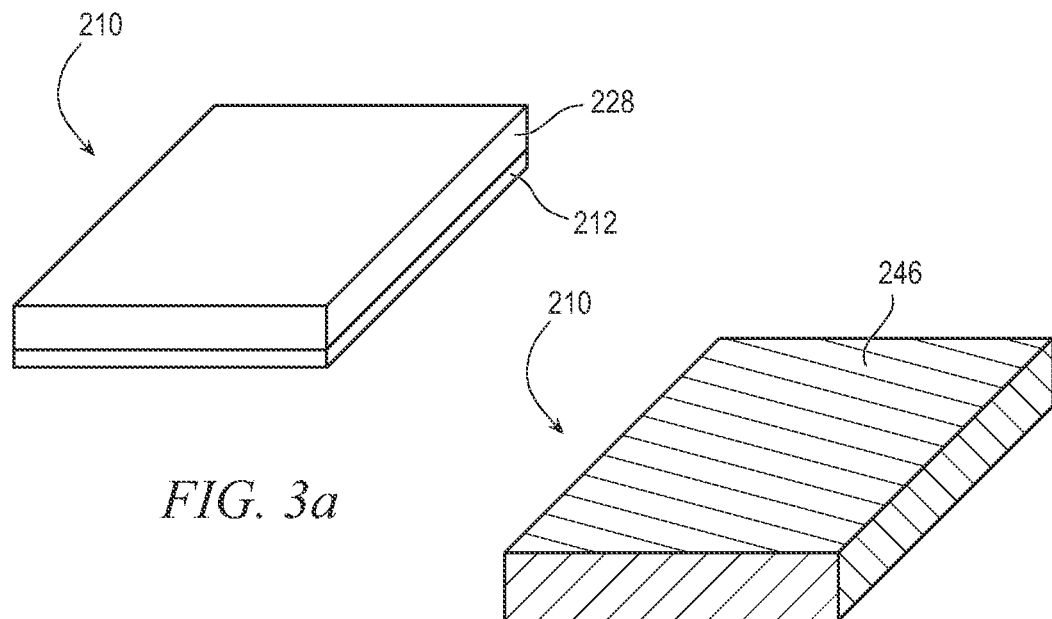
FIG. 3a
FIG. 3b
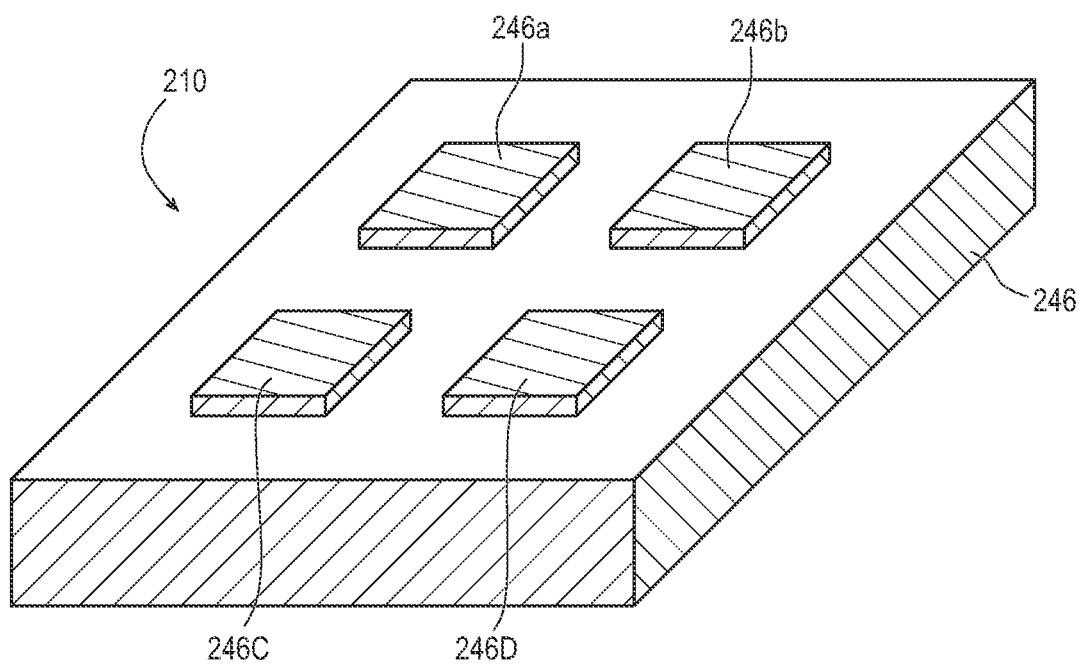
FIG. 3c

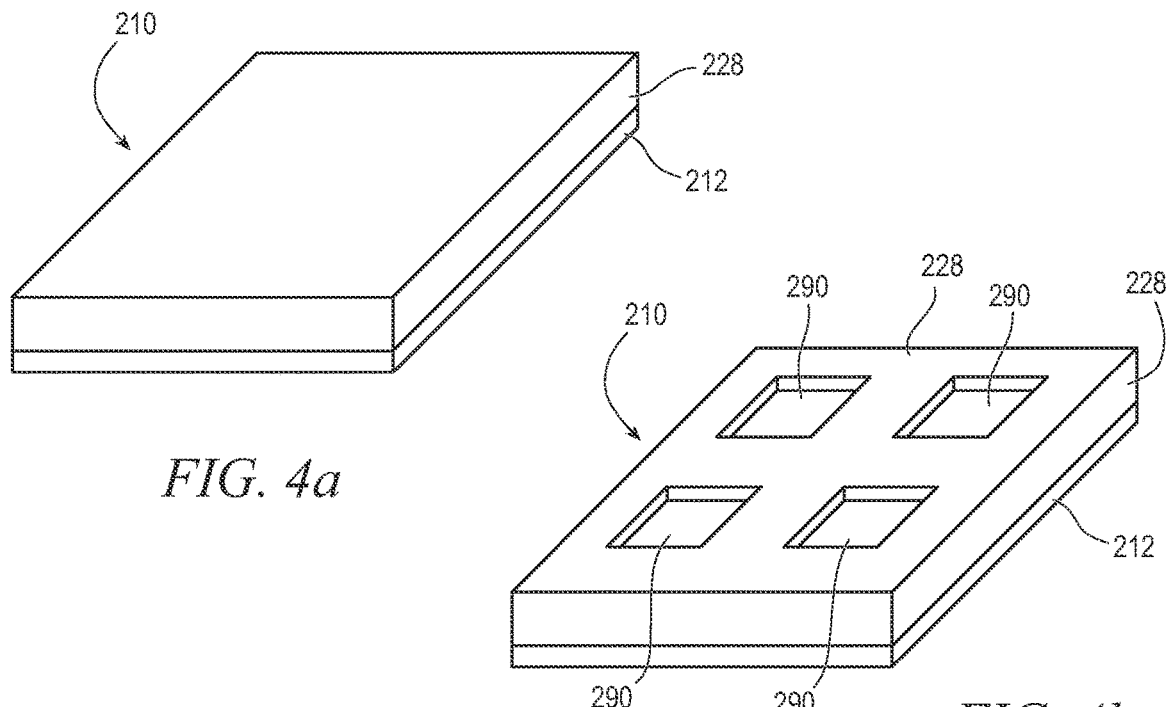
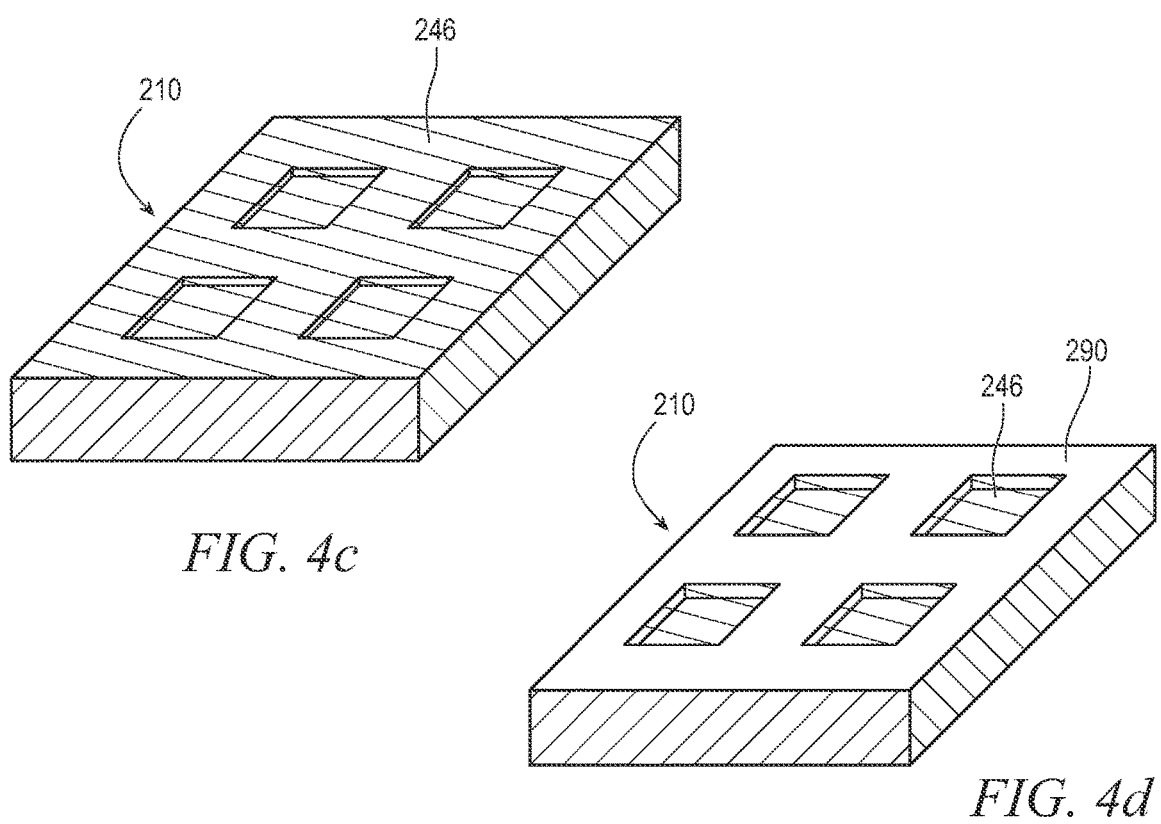

US 11,610,847 B2

LASER-BASED REDISTRIBUTION AND MULTI-STACKED PACKAGES

FIELD OF THE INVENTION

The present invention relates in general to semiconductor manufacturing and, more particularly, to a semiconductor device and method for forming electromagnetic interference (EMI) shielded packages with laser-based redistribution and multi-stacked packages.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

Conductive layers are commonly formed over semiconductor packages to shield electronic parts within the package from EMI and other interference. Shielding layers absorb EMI before the signals can hit semiconductor die and discrete components within the package, which might otherwise cause malfunction of the device. Shielding layers are also formed over packages with components that are expected to generate EMI to protect nearby devices.

One problem with prior art methods of semiconductor package shielding is that the methods of forming shielding layers over packages can make forming multi-layer packages difficult. However, as electronic devices are getting smaller and performing more functions, the devices must accommodate a higher density of components in a limited area. Stacking multiple layers in a package is one option for increasing component density but is made difficult when EMI shielding is involved. Therefore, a need exists for semiconductor devices and methods of making semiconductor devices with EMI shielding and multiplayer stacked layers of components.

BRIEF DESCRIPTION OF THE DRAWINGS

FIGS. 3a-3c illustrate forming the EMI shielding layer areas embossed over encapsulant;

FIGS. 4a-4d illustrate forming the EMI shielding layer areas engraved into encapsulant;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices. The terms "die" and "semiconductor die" are used interchangeably.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, wirebonds, or other suitable interconnect structures. An encapsulant or other molding compound is deposited over the package to provide physical support and electrical isolation. The finished package is then inserted into an electrical system and the functionality of the semiconductor device is made available to the other system components.

Figure 1A:
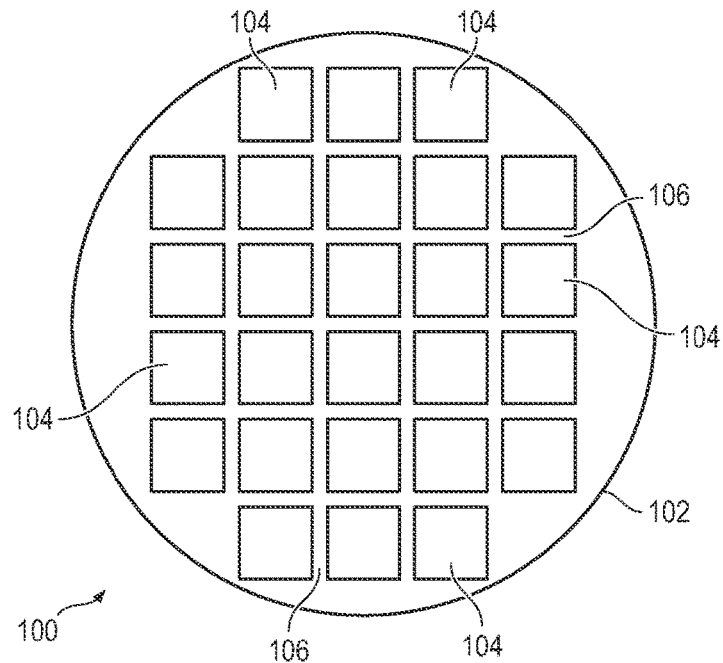
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
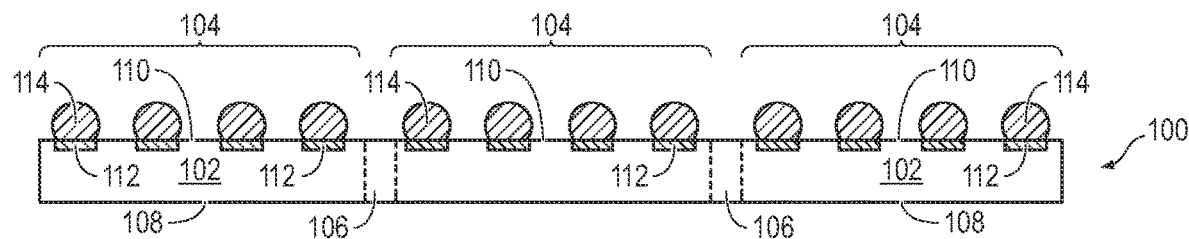

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1B. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. Conductive bumps 114 are optionally formed over an under-bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bumps, micro bumps, or other electrical interconnects.

Figure 1C:
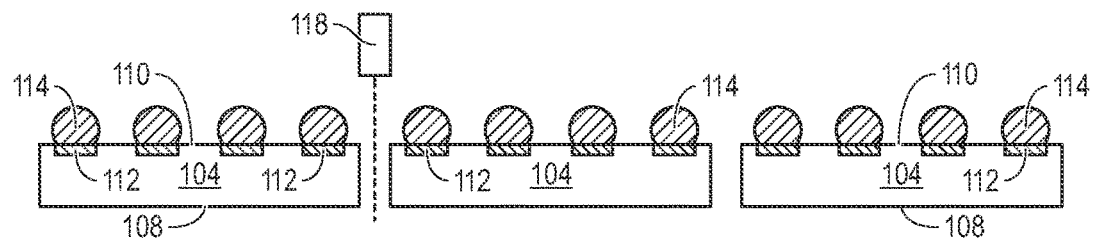

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post-singulation.

Figure 2A:
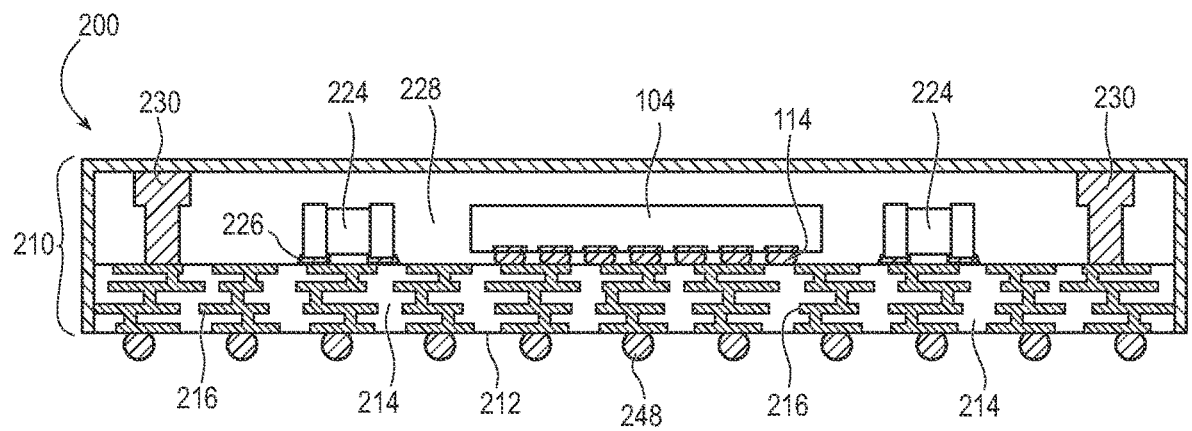
FIGS. 2a-2h illustrate forming a double-layered package with laser-based redistribution and EMI shielding.

FIG. 2a illustrates a cross-sectional view of an exemplary semiconductor package 200 being formed with semiconductor die 104. FIG. 2a shows semiconductor package 200 in an intermediate formation step wherein a first layer 210 of the package has been completed. Substrate 212 includes one or more insulating layers 214 interleaved with one or more conductive layers 216. Insulating layer 214 is a core insulating board in one embodiment, with conductive layers 216 patterned over the top and bottom surfaces, e.g., a copper-clad laminate substrate. Conductive layers 216 also include conductive vias electrically coupled through insulating layers 214 for vertical interconnect.

Substrate 212 can include any number of conductive layers 216 and insulating layers 214 interleaved over each other. A solder mask or passivation layer can be formed over either side or both sides of substrate 212. Openings are formed in the passivation layer to expose contact pads of conductive layer 216 for subsequent interconnection. Any suitable type of substrate or leadframe is used for substrate 212 in other embodiments. Typically, first layer 210 is formed on substrate 212 as a panel or strip large enough to form several to hundreds or thousands of packages at one time. First layer 210 can be singulated from the strip once completed, or packages 200 are singulated into individual packages after completion of all desired layers.

Any components desired for the functionality of first layer 210 are mounted on or disposed over substrate 212 and electrically connected to conductive layers 216 using solder, solder paste, bond wires, or another suitable mechanism. FIG. 2a illustrates semiconductor die 104 mounted on substrate 212 along with discrete electrical components 224. Discrete electrical components 224 can be passive components such as capacitors, resistors, or inductors, active components such as diodes or transistors, or any other desired electrical component. Multiple semiconductor die can be disposed on substrate 212. Semiconductor die 104 can be provided as part of a smaller sub-package rather than a bare die. Any desired electrical component can be mounted on substrate 212, such as passive devices, semiconductor die, wafer-level chip-scale packages (WLCSP), or system-in-package (SiP) modules. The mounted components can have EMI shielding layers formed over the individual components in addition to shielding provided as part of forming semiconductor package 200.

Semiconductor die 104 is mounted to substrate 212 by disposing the semiconductor die on the substrate using, e.g., a pick-and-place process or machine, and then reflowing bumps 114 to physically and electrically connect the bumps to exposed contact pads of conductive layer 216. Discrete components 224 are connected by similar solder bumps or solder paste 226. Solder paste 226 can be printed onto substrate 212 or discrete components 224 prior to picking and placing the discrete components onto the substrate. Reflowing solder paste 226 physically and electrically couples discrete components 224 to contact pads of conductive layer 216.

After mounting of semiconductor die 104, discrete components 224, and any other desired electrical components onto substrate 212, the components are encapsulated by encapsulant or molding compound 228. Encapsulant 228 is deposited over substrate 212, semiconductor die 104, and discrete components 224 using paste printing, compressive molding, transfer molding, liquid encapsulant molding, vacuum lamination, spin coating, or another suitable applicator. Encapsulant 228 can be polymer composite material, such as epoxy resin, epoxy acrylate, or polymer with or without a filler. Encapsulant 228 is non-conductive, provides structural support, and environmentally protects the semiconductor device from external elements and contaminants.

Openings are formed through encapsulant 228 to expose contact pads of conductive layers 216. The openings are filled with a conductive material using any suitable metal deposition technique to form conductive vias 230. The openings for conductive vias 230 can be formed by mechanical drilling, chemical etching, laser drilling, or any other suitable process. The conductive material can be Al, Cu, Sn, Ni, Au, Ag, or other suitable electrically conductive material. Conductive vias 230 provide vertical interconnect between first layer 210 and subsequently formed layers of semiconductor package 200. In other embodiments, conductive vias 230 are formed on substrate 212 as conductive pillars, solder bumps, copper-clad solder bumps (CCSB), PCB units, modular interconnect units, or any other suitable interconnect structure prior to deposition of encapsulant 228. When conductive vias 230 are formed prior to deposition of encapsulant 228, the encapsulant undergoes a backgrinding process to expose the conductive vias if necessary.

Substrate 212 and encapsulant 228 in combination with the enclosed components are a panel of multiple devices connected together, of which FIG. 2a shows only a single one. After encapsulation with encapsulant 228, the panel is optionally singulated into the individual devices using a saw blade, laser cutting tool, water cutting tool, or other suitable implement, which exposes side surfaces of the encapsulant and substrate 212 for each individual unit. The units remain in place for further processing or can be moved to another carrier to allow for additional spacing between units. In other embodiments, no singulation occurs until all or a portion of the desired layers are completed. Forming subsequent layers while the underlying layers remain as a strip or panel of units, rather than individual units, will make molding the subsequent layers easier for some manufacturing processes. In one embodiment, packages 200 are kept as an unsingulated panel until after a final layer is fully formed but before forming a final shielding layer so that the final shielding layer provides shielding for the side surfaces of all layers.

A conductive material is sputtered over first layer 210 to form a shielding layer 246. Shielding layer 246 is formed using any suitable metal deposition technique, e.g., chemical vapor deposition, physical vapor deposition, other sputtering methods, spraying, or plating. The sputtered material can be copper, steel, aluminum, gold, combinations thereof, or any other suitable material. Shielding layer 246 completely covers exposed surfaces of encapsulant 228, substrate 212, and conductive vias 230.

In particular, all four side surfaces and the top surface of encapsulant 228 are covered by shielding layer 246 to surround the encapsulated components. All side surfaces of substrate 212 are covered by shielding layer 246. Shielding layer 246 is typically not formed on the bottom surface of substrate 212 because the sputtering process deposits metal molecules from above. Shielding layer 246 is not formed on the top surface of substrate 212 due to the presence of encapsulant 228. In other embodiments, the top surface of substrate 212 is partially exposed from encapsulant 228 to allow shielding layer 246 to contact the top surface. Conductive layer 216 can be exposed at sides of substrate 212 to connect shielding layer 246 to ground through the substrate.

Bumps 248 are formed on the bottom surface of substrate 212 at any stage in the manufacturing process. Bumps 248 are similar to and formed in a similar manner to bumps 114 on semiconductor die 104. While one specific package type is shown for first layer 210, the first layer can be formed in any suitable package type, such as an embedded wafer-level ball-grid array (eWLB) or a double-sided SiP module where both sides of substrate 212 have encapsulated components.

Figure 2B:
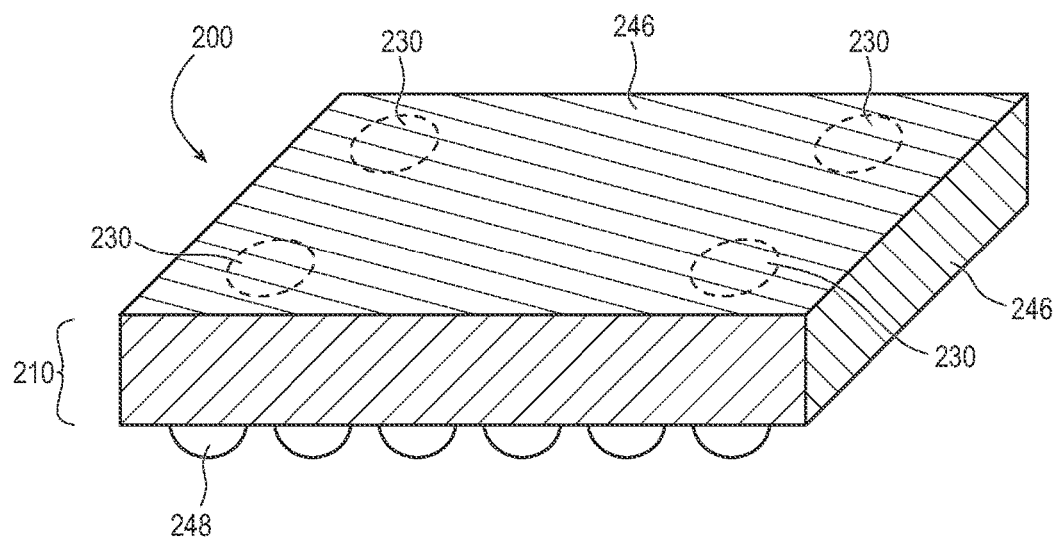

FIG. 2b shows first layer 210 in a perspective view fully covered by shielding layer 246. The positions of conductive vias 230 under shielding layer 246 are indicated by dotted lines. Only four conductive vias 230 are illustrated, but typically many more conductive vias would be formed as needed to transmit power, ground, data, address, clock, and any other desired signal between layers.

Figure 2C:
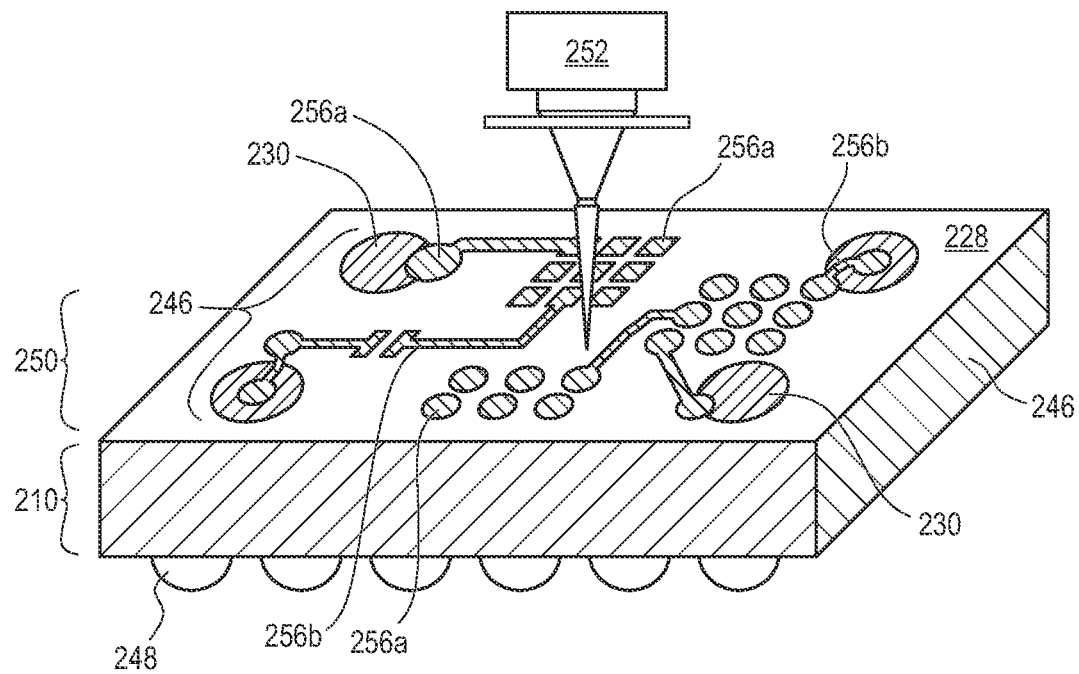

In FIG. 2c, formation of a second layer 250 is begun by using laser 252 to pattern shielding layer 246 into a plurality of contact pads 256a, conductive traces 256b, and any other desired conductive structures. Laser 252 can be a diode-pumped solid-state (DPSS) laser, an excimer laser, a $CO_2$ laser, or a neodymium (Nd), erbium (Eb), or ytterbium (Yb) doped Yttrium aluminum garnet (YAG) laser. Laser 252 can emit light in the ultraviolet, visible light, or infrared spectra. Pulsed laser patterning can be performed with a pulse on the order of microseconds (μs), nanoseconds (ns), or femtoseconds (fs). Any other suitable types of laser and patterning processes are used in other embodiments. Any suitable etching means can be used as desired.

Laser 252 selectively removes shielding layer 246. The areas where shielding layer 246 is removed result in encapsulant 228 being exposed. The areas where shielding layer 246 is not removed by laser 252 remain as contact pads 256a, conductive traces 256b, and any other desired conductive structures. Contact pads 256a are distributed as desired for connection to underlying vias 230, for subsequent mounting of semiconductor components, and for subsequent interconnect to overlying layers if additional layers are to be formed. For example, arrays of contact pads 256a remain for application of flip-chip or surface mount integrated circuits. A contact pad pair is left for mounting of a discrete passive device. Contact pads 256a remain on conductive vias 230 to connect second layer 250 to the underlying components of first layer 210. Conductive traces 256b connect contact pads 256a to each other as necessary to implement the desired electrical functionality of package 200. In some embodiments, portions of shielding layer 246 are left to operate as EMI shielding. While only the portion of shielding layer 246 on the top surface of encapsulant 228 is illustrated as being patterned, laser 252 can also be used to pattern the sidewalls of the shielding layer if desired.

Figure 2D:
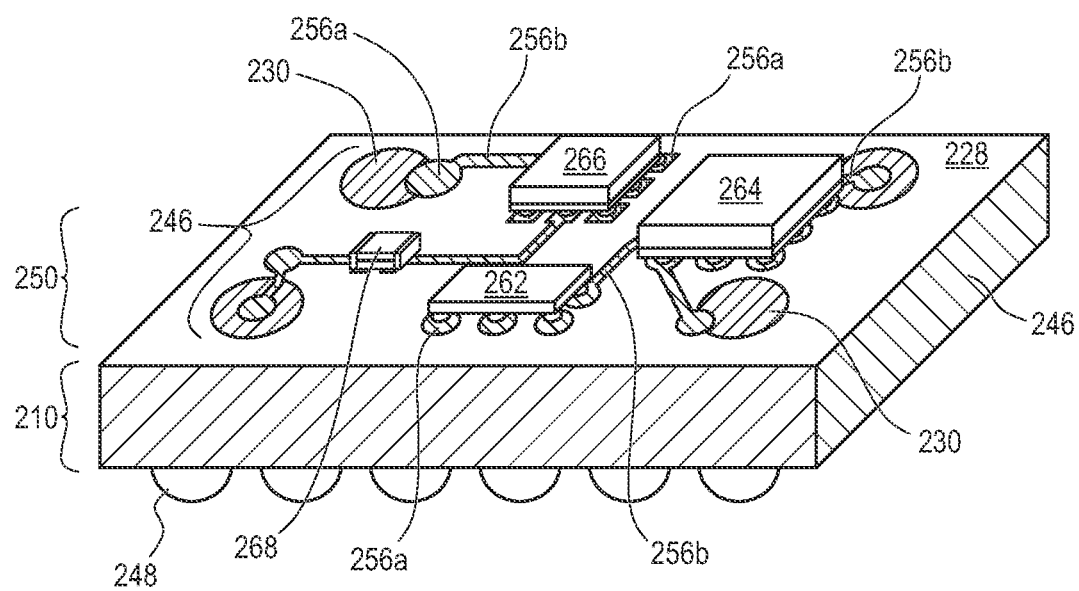

FIG. 2d shows semiconductor die 262, eWLB package 264, WLCSP 266, and discrete capacitor 268 mounted onto contact pads 256a. The mounted components are disposed over first layer 210 using any suitable process, such as with a pick-and-place machine. Solder bumps or paste reflowed between contact pads of the mounted components 262-268 and contact pads 256a provide both a mechanical and an electrical coupling. A mold underfill can be deposited between the components and first layer 210. Any desired electrical components can be mounted onto shielding layer 246 as part of second layer 250 after patterning the shielding layer. The components can be any discrete passive or active device, a bare die, a WLCSP, or a single or double-side molded SiP module. Any of the components optionally have their own shielding layers formed over or within the individual components in addition to shielding formed as part of package 200.

Figure 2E:
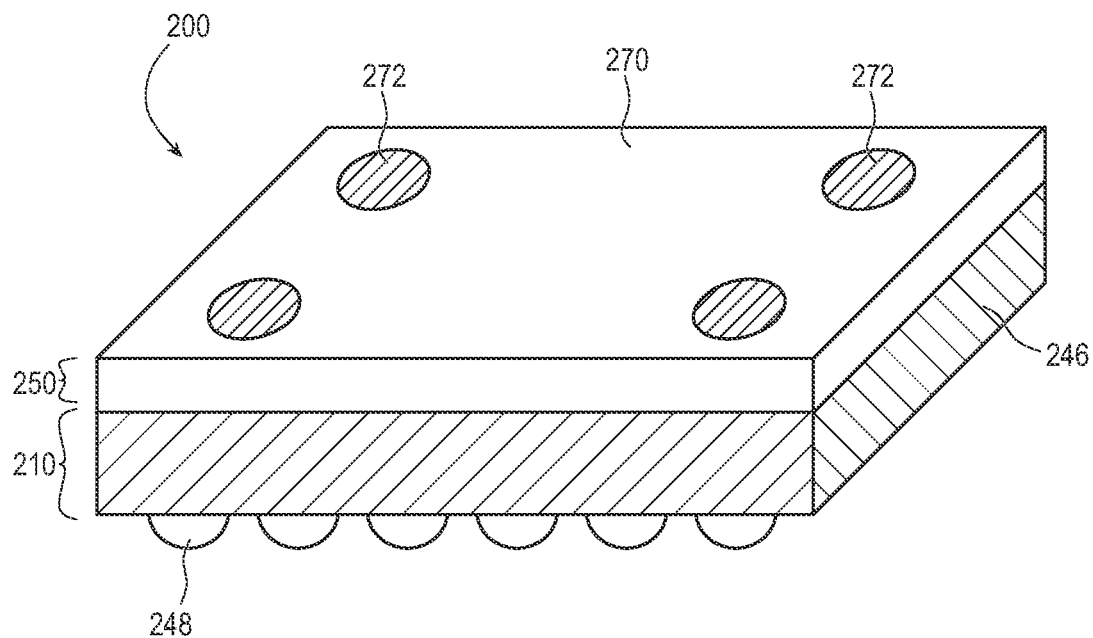

In FIG. 2e, encapsulant 270 is deposited over mounted components 262-268 to provide a package body for second layer 250. Encapsulant 270 is similar to encapsulant 228, i.e., deposited in a similar process and formed of a similar material. Encapsulant 270 can be formed using a mold to keep the encapsulant contained over the footprint of the singulated first layer 210 units. In another embodiment, encapsulant 270 is deposited between individual first layer 210 units and then removed. A preformed sheet of encapsulant 270 can be laminated over a plurality of first layer 210 units to allow the encapsulant to cover multiple units without flowing down between the units over shielding layer 246. The preformed sheet of encapsulant 270 can be partially cured in advance to allow the encapsulant to envelop devices mounted as part of second layer 250 without being fully liquid. In embodiments where first layer 210 remains as an unsingulated panel or strip, liquid encapsulant can be deposited without issues related to encapsulant 270 flowing between units of the first layer.

Conductive vias 272 are formed through encapsulant 270 in a similar manner to conductive vias 230 above. Conductive vias 272 can be formed directly over conductive vias 230 or at other locations depending on the desired functionality of package 200. Conductive vias 272 are optional and may not be formed in embodiments where there is no need for additional vertical routing beyond second layer 250. Instead of using conductive vias 230 and 272, vertical routing can be provided by patterning the sidewalls of the shielding layers.

Figure 2F:
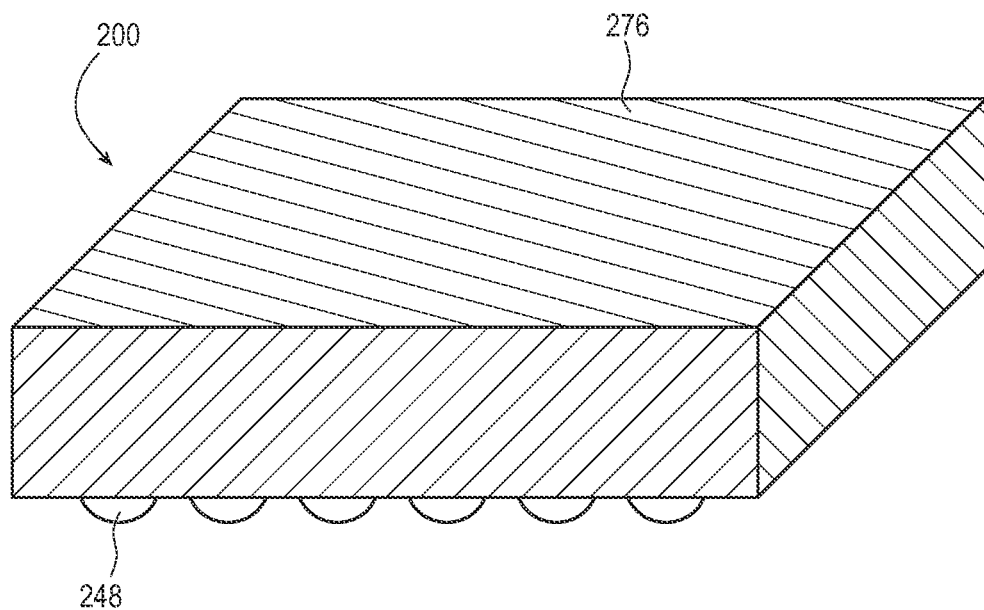

FIG. 2f shows shielding layer 276 formed over second layer 250 of package 200. Shielding layer 276 is formed in a similar manner to and of similar materials as shielding layer 246. Shielding layer 276 contacts and fully covers the top surface and all side surfaces of encapsulant 270. Shielding layer 276 physically contacts the exposed top surfaces of conductive vias 272, which electrically connect shielding layer 276 to contact pads 256a, conductive traces 256b, and the components mounted thereon as part of second layer 250. Shielding layer 276 is also formed over the sides of first layer 210 where shielding layer 246 still remains exposed. Therefore, first layer 210 now includes a double shielding layer of both shielding layer 246 and shielding layer 276 completely surrounding the first layer.

Figure 2G:
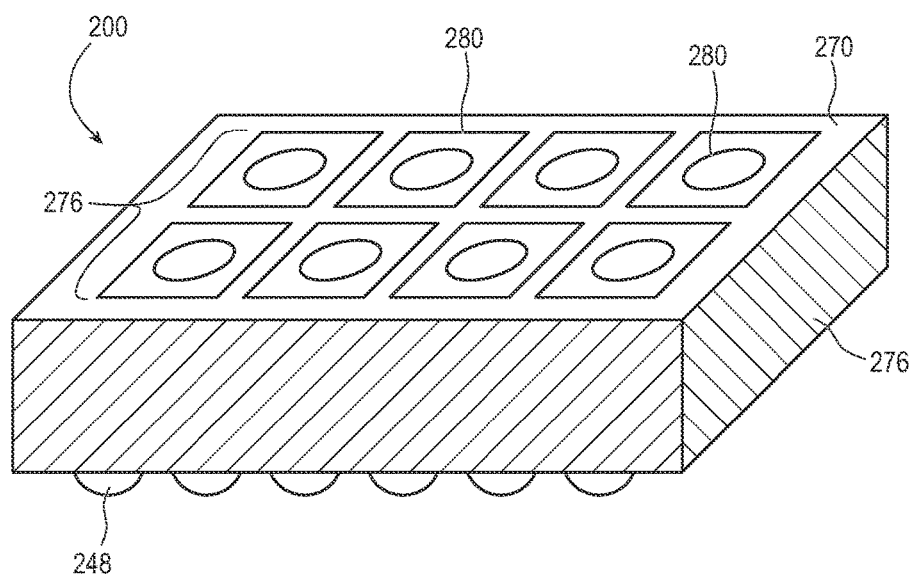

In FIG. 2g, shielding layer 276 is patterned into any desired conductive structures, again using laser 252 or another suitable process. FIG. 2g shows an array of patch antennae 280 formed out of shielding layer 276 over encapsulant 270. Any type of micro-strip line or patch antenna can be formed. Any suitable patch shape can be used, such as rectangular, circular, triangular, U-shaped, or E-shaped. In one embodiment, package 200 is a 5G transceiver and shielding layer 276 is formed into an antenna suitable for 5G transmissions. Antennae 280 are electrically coupled to the underlying components of first layer 210 and second layer 250 by conductive vias 272, conductive traces 256b, conductive vias 230, and conductive layer 216.

Figure 2H:
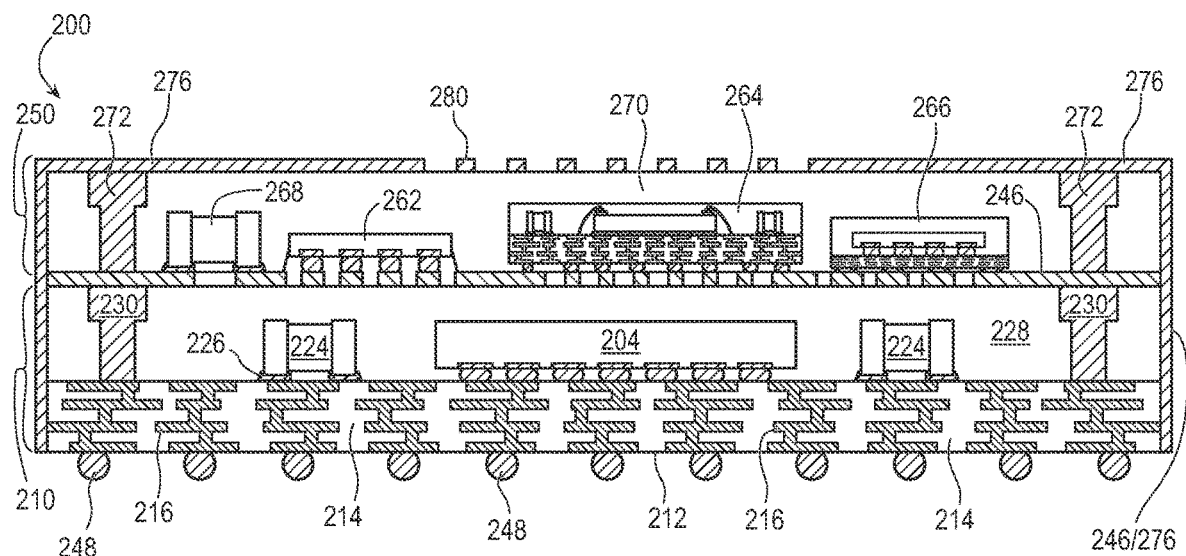

FIG. 2g shows a perspective view of completed package 200, while FIG. 2h shows a cross-sectional view. Package 200 includes two layers of components, first layer 210 and second layer 250. Shielding layer 246 formed on first layer 210 is patterned to operate as a redistribution layer for second layer 250. Shielding layer 276 formed on second layer 250 is patterned to operate as an antenna or to serve any other desired purpose. Utilizing a patterned shielding layer as a redistribution layer or antenna reduces package size, allows a higher density package, improves device performance, and allows a wider variety of part functionality to be integrated into a single package.

In some embodiments, shielding layer 276 is patterned into a plurality of contact pads as with shielding layer 246 so that a board-to-board (B2B) connector or other components can be mounted onto package 200. Patterning shielding layers 246 and 276 using laser 252 provides circuit design flexibility, including formation of redistribution layers and antenna patterns. Any portion of shielding layers 246 and 276 can have a connection to ground to have an EMI shielding effect.

Each package layer can have its respective shielding layer pattern formed either embossed over or engraved into the top surface of its respective encapsulant. FIGS. 3a-3c show forming a shielding layer embossed, while FIGS. 4a-4d show forming a shielding layer engraved. FIG. 3a shows first layer 210 after encapsulation. Shielding layer 246 is applied over flat surfaces of encapsulant 228 in FIG. 3b. In FIG. 3c, shielding layer 246 is patterned with laser 252. The remaining portions 246a-246d of shielding layer 246 have a height over the top surface of encapsulant 228 equivalent to the thickness of the shielding layer. The thickness of portions 246a-246d in FIG. 3c is exaggerated for illustration. While only four squares are illustrated, any suitable pattern can be formed for any desired purpose.

Alternatively, the shielding layer 246 pattern can be embedded or engraved into the top surface of encapsulant 228 rather than embossed over. FIG. 4a again shows first layer 210 after encapsulation but before formation of a shielding layer. In FIG. 4b, the desired pattern for shielding layer 246 is first etched into encapsulant 228. The etching can be any suitable etching process, such as chemical etching, laser etching, or mechanical etching. Etching forms cavities 290 into the top surface of encapsulant 228 corresponding to the contact pads, conductive traces, and other structures desired for the final patterned form of shielding layer 246.

In FIG. 4c, shielding layer 246 is formed over encapsulant 228 and cavities 290. Shielding layer 246 is formed as a conformal coating that conforms to the shape of cavities 290 in one embodiment. In another embodiment, shielding layer 246 completely fills cavities 290. In FIG. 4d, shielding layer 246 is removed from the remaining top surface of encapsulant 228 outside of cavities 290. Shielding layer 246 is removed using laser patterning with laser 252 in one embodiment. A two-step process can be used by first hatching and then peeling shielding layer 246. In other embodiments, the desired portions of shielding layer 246 can be removed by mechanically grinding the top of first layer 210. Shielding layer 246 remains conformally coated over the side and bottom surfaces within cavities 290. In some embodiments, shielding layer 246 remains completely filling cavities 290. Any of the shielding layers disclosed herein for any package layer can have its patterning done either embossed or engraved.

Figure 5A:
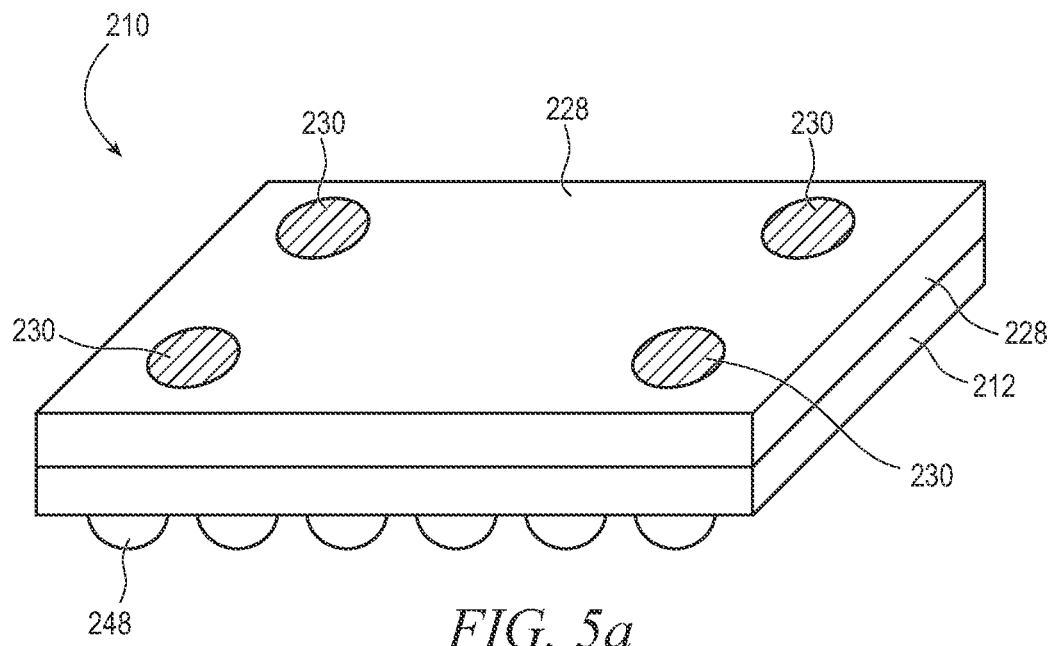
FIGS. 5a and 5b illustrate forming the patterned layer using a printing process.
Figure 5B:
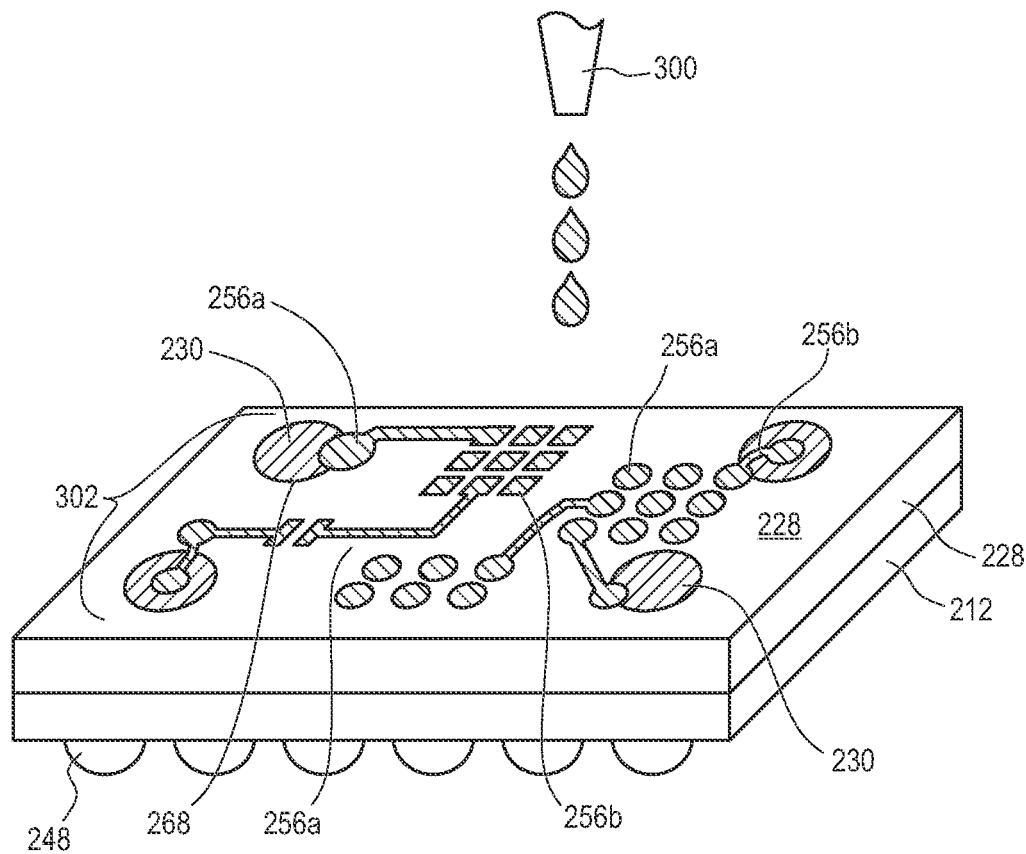

FIGS. 5a and 5b show a process whereby the redistribution layers are formed by printing instead of laser etching. FIG. 5a shows first layer 210 with encapsulant 228 deposited but without shielding layer 246. Instead of forming shielding layer 246 over the entire package and then patterning the shielding layer into the desired electrical structures, a redistribution layer is simply printed on the top surface of encapsulant 228. FIG. 5b shows an inkjet or electrohydrodynamic (EHD) jet nozzle 300 depositing conductive material over encapsulant 228 to print the desired circuit pattern 302. Circuit printing allows a finer line width compared to laser etching, while still being able to form any of the same conductive structures. In one embodiment, hole formation for conductive vias 230 is done using laser 252, and then the holes are filled by inkjet nozzle 300. Any package layer can be formed as shown in FIG. 5b, including the top layer.

Figure 6:
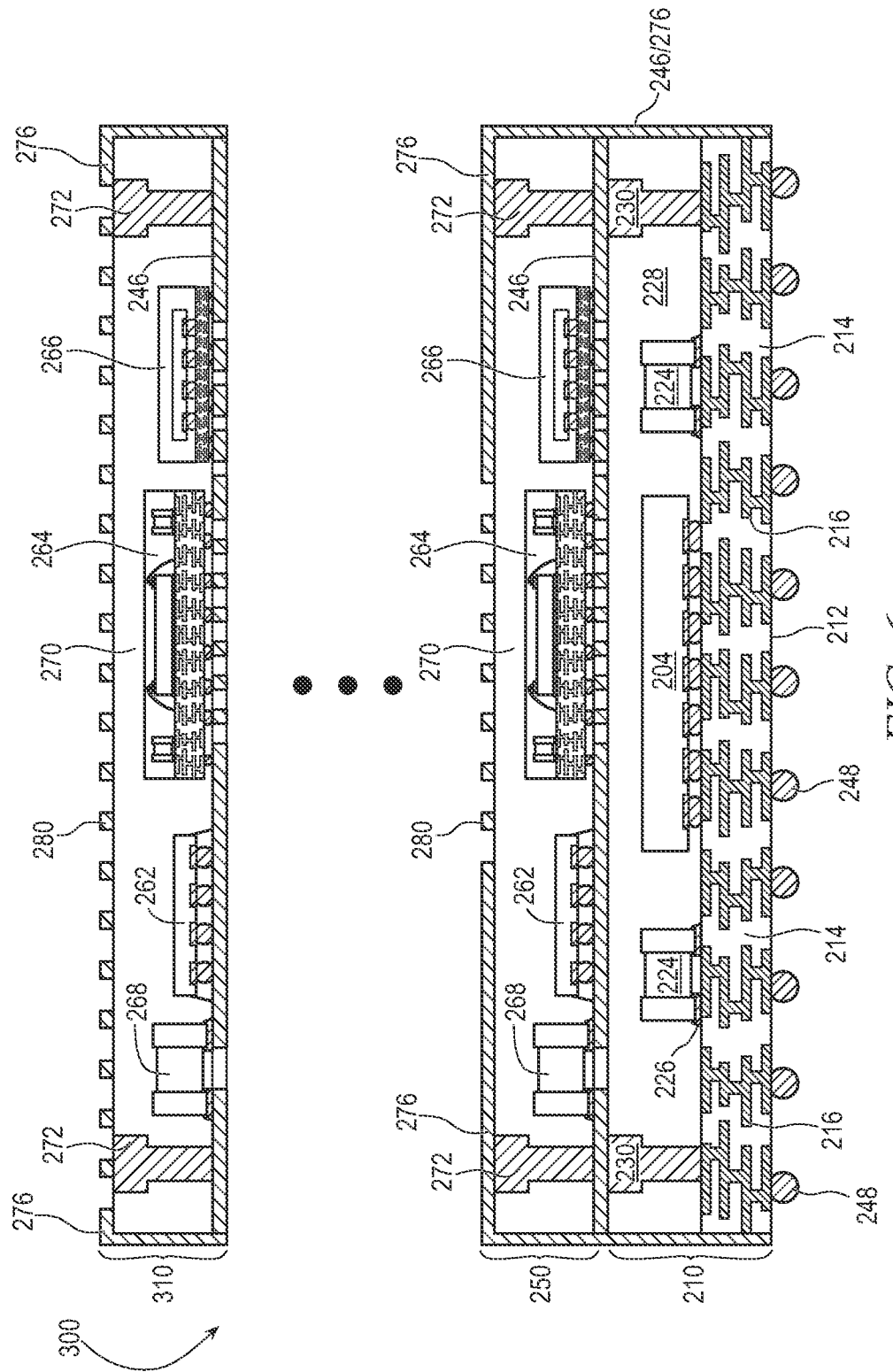
FIG. 6 illustrates successive formation of any number of layers.

FIG. 6 shows stacking additional layers indefinitely to any suitable number of layers. While the embodiments above show only two layers 210 and 250, additional layers can continue being formed indefinitely. Shielding layer 276 is patterned to accommodate any desired electrical components for the third layer, followed by being encapsulated, shielded, and then having the shielding layer patterned. The process of patterning, component mounting, molding or partial molding, and then metal deposition or EMI shielding can be repeated indefinitely until the desired top layer 310 is formed. Top layer 310 can have antennae or terminals for a B2B connector formed thereon.

Figure 7A:
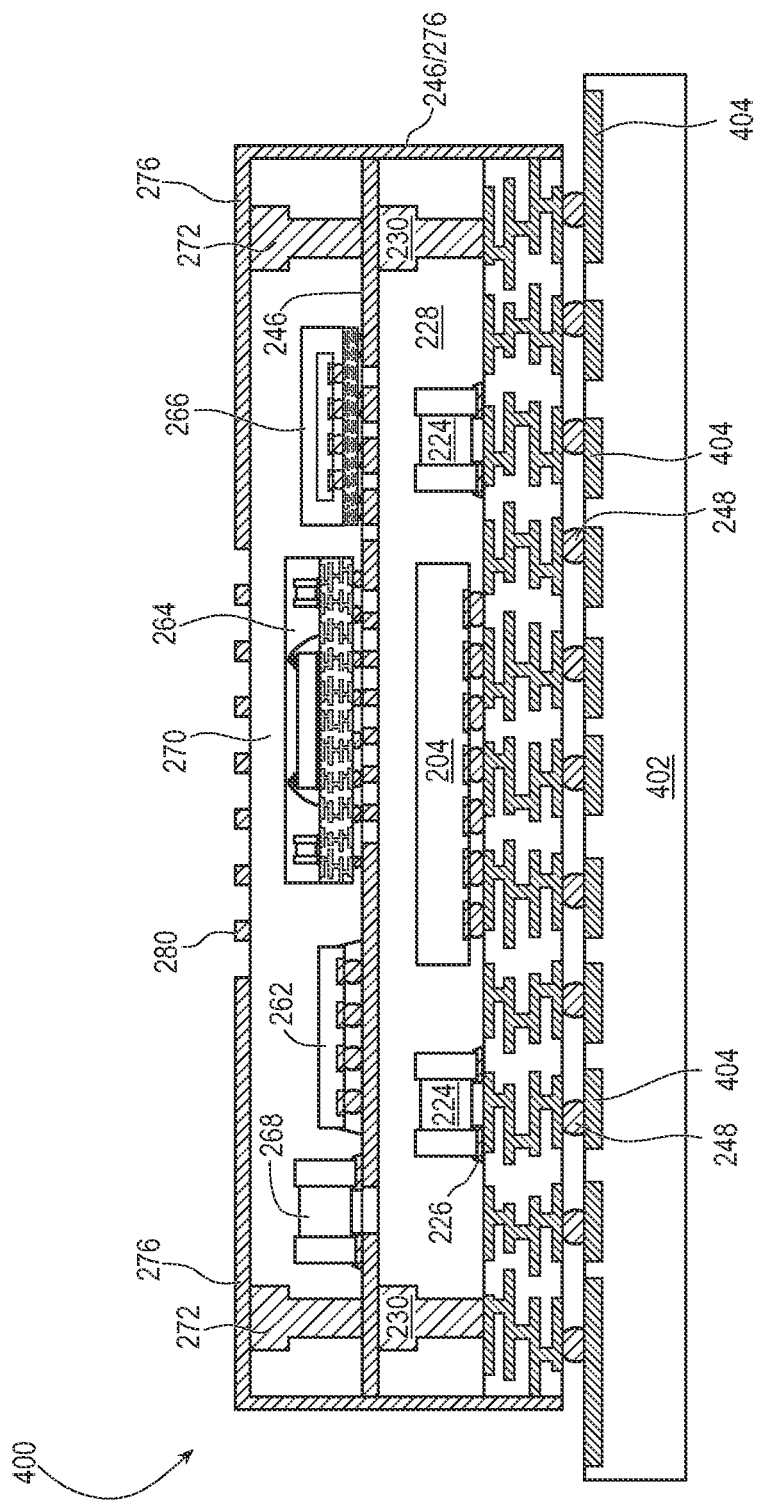
FIGS. 7a and 7b illustrate integrating the multi-layer packages into an electronic device.
Figure 7B:
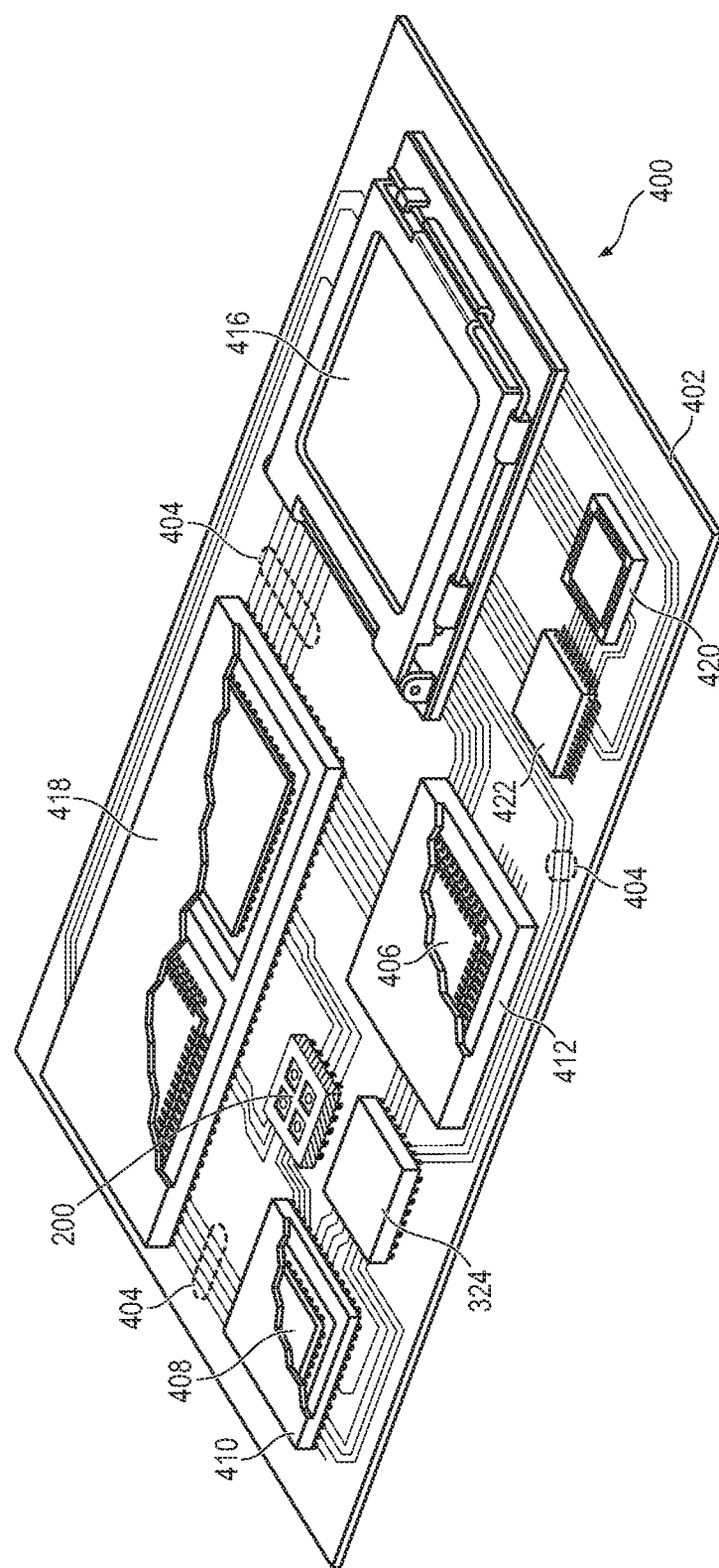

FIGS. 7a and 7b illustrate incorporating the above-described packages, e.g., package 200 with first layer 210 and second layer 250, into an electronic device 400. FIG. 7a illustrates a partial cross-section of package 200 mounted onto a printed circuit board (PCB) or other substrate 402 as part of electronic device 400. Bumps 248 are formed on conductive layer 216 on the bottom of substrate 212. Conductive bumps 248 can be formed at any stage of the manufacturing process, e.g., prior to molding encapsulant 228, prior to singulation, or after forming and patterning shielding layer 276. Bumps 248 are reflowed onto conductive layer 404 of PCB 402 to physically attach and electrically connect package 200 to the PCB. In other embodiments, thermocompression or other suitable attachment and connection methods are used. In some embodiments, an adhesive or underfill layer is used between package 200 and PCB 402. Semiconductor die 104 is electrically coupled to conductive layer 404 through substrate 212 and bumps 248.

FIG. 7b illustrates electronic device 400 with a plurality of semiconductor packages mounted on a surface of PCB 402, including package 200. Electronic device 400 can have one type of semiconductor package, or multiple types of semiconductor packages, depending on the application. Electronic device 400 can be a stand-alone system that uses the semiconductor packages to perform one or more electrical functions. Alternatively, electronic device 400 can be a subcomponent of a larger system. For example, electronic device 400 can be part of a tablet computer, cellular phone, digital camera, communication system, or other electronic device. Electronic device 400 can also be a graphics card, network interface card, or another signal processing card that is inserted into a computer. The semiconductor packages can include microprocessors, memories, ASICs, logic circuits, analog circuits, RF circuits, discrete active or passive devices, and other semiconductor die or electrical components.

In FIG. 7b, PCB 402 provides a general substrate for structural support and electrical interconnection of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between the semiconductor packages, mounted components, and other external systems or components. Traces 404 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 402. In other embodiments, a semiconductor device may only have the first level packaging where the die is mechanically and electrically mounted directly to PCB 402.

For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) 418, quad flat non-leaded package (QFN) 420, quad flat package 422, and eWLB 424 are shown mounted on PCB 402 along with package 200. Conductive traces 404 electrically couple the various packages and components disposed on PCB 402 to package 200, giving use of the components within package 200 to other components on the PCB.

Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first package layer;
   forming a first shielding layer over the first package layer;
   patterning the first shielding layer to form a redistribution layer;
   disposing an electrical component over the redistribution layer;
   depositing an encapsulant over the electrical component;
   forming a second shielding layer over the encapsulant; and
   patterning the second shielding layer.

2. The method of claim 1, further including patterning the first shielding layer and second shielding layer using a laser.

3. The method of claim 1, further including patterning the second shielding layer to include an antenna.

4. The method of claim 1, further including forming a conductive via through the encapsulant, wherein the electrical component is coupled to the second shielding layer through the conductive via.

5. The method of claim 1, further including:
   forming a patterned cavity in the encapsulant; and
   patterning the second shielding layer to match the patterned cavity.

6. The method of claim 1, further including:
   patterning the second shielding layer to include a contact pad; and
   disposing a board-to-board (B2B) connector over the contact pad.

7. A method of making a semiconductor device, comprising:
   providing a first package layer;
   forming a patterned cavity in the first package layer;
   forming a first shielding layer over the first package layer;
   patterning the first shielding layer to form a redistribution layer matching the patterned cavity;
   forming a second package layer utilizing the redistribution layer;
   forming a second shielding layer over the second package layer; and
   patterning the second shielding layer.

8. The method of claim 7, further including patterning the first shielding layer and second shielding layer using a laser.

9. The method of claim 7, further including patterning the second shielding layer to include an antenna.

10. The method of claim 7, further including coupling the first package layer to the second package layer through the redistribution layer.

11. The method of claim 7, further including disposing a board-to-board (B2B) connector over the second shielding layer.

12. The method of claim 7, further including forming the redistribution layer to include a ground plane.

13. A method of making a semiconductor device, comprising:
   providing a first package layer;
   forming a first redistribution layer over the first package layer;
   depositing a second encapsulant over the first redistribution layer;
   forming a second redistribution layer over the second encapsulant;
   depositing a first encapsulant over the first redistribution layer and second encapsulant;
   forming a first shielding layer over the first encapsulant; and
   patterning the first shielding layer.

14. The method of claim 13, further including forming the first redistribution layer by inkjet or electrohydrodynamic jet printing.

15. The method of claim 13, further including forming the first redistribution layer embedded into the first package layer.

16. The method of claim 13, wherein the first redistribution layer and second redistribution layer are formed using inkjet or electrohydrodynamic jet printing.

17. The method of claim 13, further including patterning the first shielding layer to form an antenna.

18. A method of making a semiconductor device, comprising:
   providing a first package layer;
   disposing a 5G transceiver within the first package layer or second package layer;
   forming a redistribution layer over the first package layer;
   forming a second package layer over the redistribution layer;
   forming an antenna over the second package layer; and
   coupling the 5G transceiver to the antenna.

19. The method of claim 18, further including forming the redistribution layer embedded in the first package layer.

20. The method of claim 18, further including forming the antenna embedded in the second package layer.

21. The method of claim 18, further including forming a conductive via through the first package layer to couple the first package layer to the redistribution layer.

22. The method of claim 18, further including:
   forming a first shielding layer around the first package layer; and
   forming a second shielding layer around the first shielding layer and first package layer.

* * * * *